United States Patent [19]
Kim et al.

[11] Patent Number: 6,114,760
[45] Date of Patent: Sep. 5, 2000

[54] BALL GRID ARRAY (BGA) SEMICONDUCTOR PACKAGE MEMBER

[75] Inventors: Jin Sung Kim, Cheongju; Yong Tae Kwon, Daeku; Kwang Sung Choi, Seoul, all of Rep. of Korea

[73] Assignee: LG Semicon Co., Ltd., Cheongju, Rep. of Korea

[21] Appl. No.: 09/010,149

[22] Filed: Jan. 21, 1998

[30] Foreign Application Priority Data

Jan. 25, 1997 [KR] Rep. of Korea .......................... 97-2153

[51] Int. Cl.[7] .......................... H01L 23/48; H01L 21/44; H01L 21/48; H01L 21/50
[52] U.S. Cl. .......................... 257/697; 438/111
[58] Field of Search .............................. 257/697; 438/111

[56] References Cited

U.S. PATENT DOCUMENTS

| | | | |
|---|---|---|---|
| 4,949,161 | 8/1990 | Allen et al. | 438/111 |
| 5,570,271 | 10/1996 | Lavochkin | 361/704 |
| 5,761,044 | 6/1998 | Nakajima | 361/719 |
| 5,854,741 | 12/1998 | Shim et al. | 361/813 |
| 5,859,475 | 1/1999 | Freyman et al. | 257/738 |

OTHER PUBLICATIONS

Assembly Process and Solder Joint Integrity of the Metal Ball Grid Array (MBGA™) Package, S. Tostado et al., Olin Interconnect Technologies, 1996 Electronic Components and Technology Conference, pp. 1265–1270.

*Primary Examiner*—Olik Chaudhuri
*Assistant Examiner*—Howard Weiss
*Attorney, Agent, or Firm*—Fleshner & Kim, LLP

[57] ABSTRACT

The present invention relates to a ball grid array (BGA) semiconductor package member and its manufacturing method employing a carrier frame and a substrate, and to a method of manufacturing a BGA semiconductor package using the BGA semiconductor package member. In manufacturing the conventional BGA semiconductor package, conventional package manufacturing equipment cannot be employed because a boat is used during processing which requires additional equipment, and thus increases the costs of production. However, a BGA semiconductor package manufacturing method employing a carrier frame and substrate according to the present invention is compatible with conventional semiconductor package manufacturing equipment. In other words, a BGA semiconductor package member is made by attaching a substrate having a multi-layer wiring therein onto a carrier frame having the same structure as a conventional lead frame, then a semiconductor chip is attached to the member and a wiring and molding processes are successively performed. The BGA semiconductor package manufacturing method according to the present invention allows computability with conventional manufacturing equipment, and automation and high speed processing of the overall manufacturing operation is achieved to thus minimize production costs and improve productivity.

16 Claims, 18 Drawing Sheets

BALL GRID ARRAY (BGA) SEMICONDUCTOR PACKAGE MEMBER

A BACKGROUND OF THE INVENTION

1. Field of the Invention

The present invention relates to a member for a ball grid array (hereafter referred to as BGA) semiconductor package and a manufacturing method of a BGA semiconductor package made of such member, and in particular, to a BGA semiconductor package member and a method for manufacturing a BGA semiconductor package using such member by employing a specially designed carrier frame and substrate which drastically improves production, yet requires the use of conventional semiconductor package manufacturing equipment.

2. Description of the Background Art

There have been many efforts to produce highly integrated multi-pin semiconductor packages. For example, a BGA semiconductor package having a plurality of solder balls attached to the substrate to be used as external terminals has been introduced. Because the BGA type package is formed by attaching a plurality of solder balls onto the lower surface of the substrate which are held together by applying heat from a furnace thereto, there are advantages in that the external terminals do not bend easily from external impacts, and that manufacturing characteristics are improved.

The conventional method of manufacturing a typical substrate for a BGA semiconductor package and of a BGA semiconductor package itself is described as follows, with reference to FIGS. 1 through 6.

First, to manufacture a BGA semiconductor package, a substrate for receiving a semiconductor chip is produced. FIGS. 1A through 1F show the conventional substrate during the conventional manufacturing process. As shown in FIG. 1A, both surfaces of a rectangular aluminum panel 1 are anodized. Chrome is sputtered onto the upper surface of the aluminum panel 1 to form a chrome seed layer 2, as shown in FIG. 1B. A photoresist pattern 3 is formed on the chrome seed layer 2 and then, copper 4, nickel 5 and gold 6 are consecutively deposited onto portions of the exposed chrome seed layer 2 which are not covered by the photoresist pattern 3, as depicted in FIG. 1C. Thus, wiring 4A comprising a triple layered configuration of copper 4, nickel 5 and gold 6 is formed.

Afterwards, the photoresist pattern 3 of FIG. 1C is removed by stripping and certain upper surface portions of the aluminum panel 1 are exposed by etching the chrome seed layer 2 using the wiring 4A as a mask. A solder mask 7 is partially applied to the wiring 4A and to the exposed portions of the aluminum panel 1 to form the structure shown in FIG. 1D.

Then, as shown in FIG. 1E, a chip cavity 8 having a certain depth is formed on the upper central portion of the aluminum panel 1. As shown in FIG. 1F, a cutter 9 is used to perform dicing of the aluminum panel 1 by cutting along the dotted lines to thusly produce a substrate 10 to be used for manufacturing a BGA semiconductor package.

FIG. 2 is a flow chart showing the steps of manufacturing a substrate for a conventional BGA package of FIGS. 1A to 1F. A method for manufacturing a BGA package using the substrate 10 made by the above described method is described as follows.

First, a boat 11 used for simultaneously packaging a plurality of chips as shown in FIG. 3 is prepared. The boat 11 has a plurality of chip receiving portions 12a, whereby the edges of the boat allow a chip to be mounted thereon and held in place by clips 11a. On the outer periphery of the boat 11, a plurality of align holes 12 are formed to allow positioning of the manufacturing equipment and the boat 11 during the package manufacturing process.

As shown in FIG. 4A, the substrate 10 of FIG. 1F is placed on the chip receiving portion 12a formed on the boat 11, and is held in place by clips 11a. FIG. 4B is a front view of the boat 11 having a substrate 10 thereon seen from the direction of the arrows.

The processes shown in FIGS. 5A to 5E are then performed. Although these figures only depict the process of packaging a single semiconductor chip on a single substrate, in actuality, a plurality of semiconductor chips are simultaneously packaged on the plurality of substrates of the boat 11. In other words, the boat 11 accommodates a plurality of individual substrates 10 so that a plurality of semiconductor chips are packaged simultaneously to improve production of semiconductor package elements.

The processes shown in FIGS. 5A to 5E are explained in detail as follows.

As shown in FIG. 5A, a die bonding process for fixedly attaching a chip 12 using an adhesive 13 onto the lower surface of a chip cavity 8 formed in the substrate 10 is performed. As shown in FIG. 5B, a wire bonding process is performed, whereby a plurality of chip pads (not shown) formed on the upper surface of the semiconductor chip 12 are connected with wiring 4A formed on the substrate 10 via metal wires 14. Then, as shown in FIG. 5C, a dam forming process is performed, whereby a dam 16 having a predetermined height is formed onto the upper surface of the substrate 10 using a liquid encapsulant of high viscosity which is applied with a dispenser 15 in order to surround the outer periphery of the chip 12.

Afterwards, as shown in FIG. 5D, a potting process is performed, whereby potting is done by using a low viscosity encapsulant using a dispenser 15 at the inner sides of the dam 16 to encapsulate the chip and metal wiring. As shown in FIG. 5E, a solder ball attach process is performed by attaching a plurality of solder balls 18 to achieve electrical connection with the wiring 4A on the upper surface of the substrate 10. Afterwards, the plurality of solder balls are fusingly attached through heat compression using a reflow process, and the residue flux generated during the reflow process is removed by a cleaning process.

After all of the above steps are finished, the BGA semiconductor package is completed by separating each of the substrates 10 from the boat 11. The above conventional BGA semiconductor package manufacturing method flow diagram is shown in FIG. 6. However, the above conventional BGA semiconductor package manufacturing method has many problems.

Firstly, conventional semiconductor package manufacturing equipment which use a lead frame cannot be employed because a specially designed boat and substrate are used to make the above conventional BGA semiconductor package. Thus, the cost of production is high due to the need for equipment to process the specially designed boat and substrate.

Secondly, processing must be carried out by hand in order to attach the substrate 10 onto the upper surface of the boat 11 having clips 11a thereon. Also, the assembly process after the substrate 10 is attached to the boat 11 must be done slowly in order to ensure that the substrate 10 does not deviate from the boat 11, which limits overall productivity.

Thirdly, for the conventional BGA semiconductor package to be applied to high power devices such as a central processing unit (CPU), a heat sink which gives off heat must be attached to the back surface of the package body, which requires the overall package thickness to be greater than 3 mm, and thus limits the desired minimization in package size.

Fourthly, a low cost transfer molding process cannot be used for manufacturing the conventional package having a cavity down type structure which allows increased heat emission, and only an expensive liquid encapsulant can be used together with a dispenser for manufacturing the conventional package.

SUMMARY OF THE INVENTION

Accordingly, the present invention has been developed in view of the above problems and the objective is to provide a BGA semiconductor package member and a BGA semiconductor package manufacturing method using such member that are appropriate for performing a packaging process using conventional equipment, and allow faster processing to improve overall productivity.

To achieve the above objectives, the BGA semiconductor package member according to the present invention comprises a carrier frame having a panel-type paddle, a side rail for supporting the paddle, and a connection portion that connect the plurality of paddles together; and a substrate formed on each paddle, the substrate comprising a body having a multi-layer circuit formed therein and a through hole formed at a central portion of the body.

The above carrier frame is either a strip type carrier frame which has a plurality of paddles connected together in a row, or a panel type carrier frame which has a plurality of strip type carrier frames connected together.

The above substrate is either a single unit substrate whereby individual substrates are separated from one another, or a strip type substrate which has a plurality of substrates connected together in a row, or a panel type substrate which has a plurality of single substrates.

Also, the manufacturing method of the BGA semiconductor package employing the above described BGA semiconductor package member comprises consecutively performing the steps of: forming a carrier frame which has a connection portion that connects the plurality of paddles; forming a substrate that has a body with a multi-layer circuit therein and has a through hole formed at a central portion thereof; attaching a semiconductor chip onto the paddles located at the inner sides of the through hole; electrically connecting the semiconductor chip with the multi-layer circuit using a conductive material; and molding the semiconductor chip and the conductive material.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

By referring to the enclosed drawings, a detailed description of the BGA semiconductor package member and its manufacturing method using a carrier frame and substrate according to the present invention, and the manufacturing method of a BGA semiconductor package employing the BGA semiconductor package member are as follows.

Figure 1A:
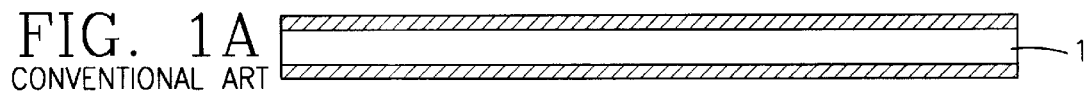
FIGS. 1A through 1F are longitudinal cross-sectional views of a conventional substrate during the manufacturing process.
Figure 1B:
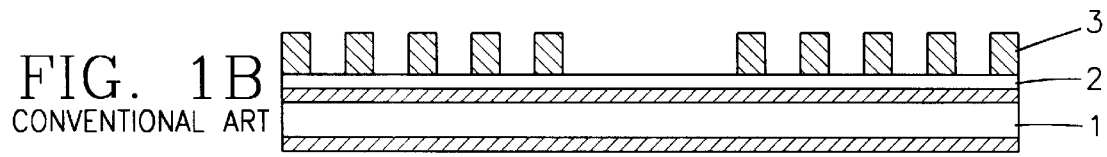
Figure 1C:
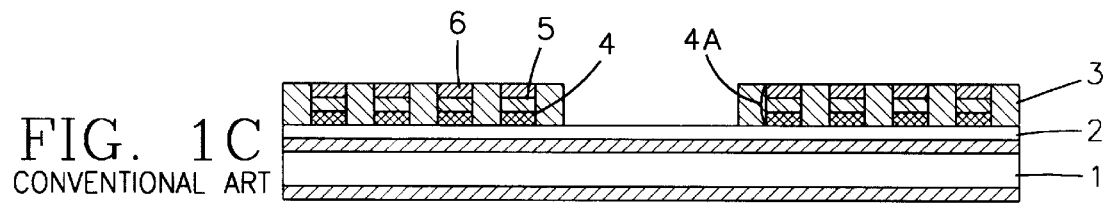
Figure 1D:
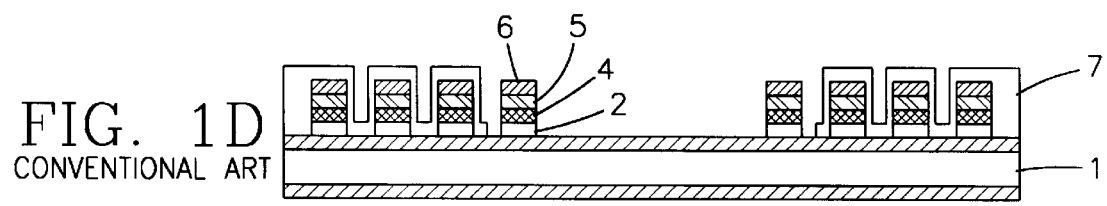
Figure 1E:
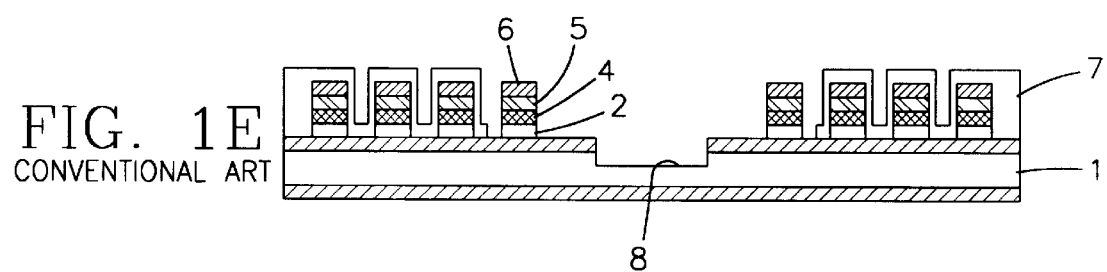
Figure 1F:
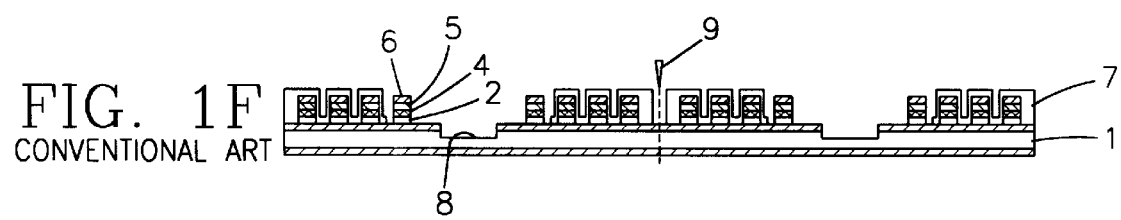
Figure 2:
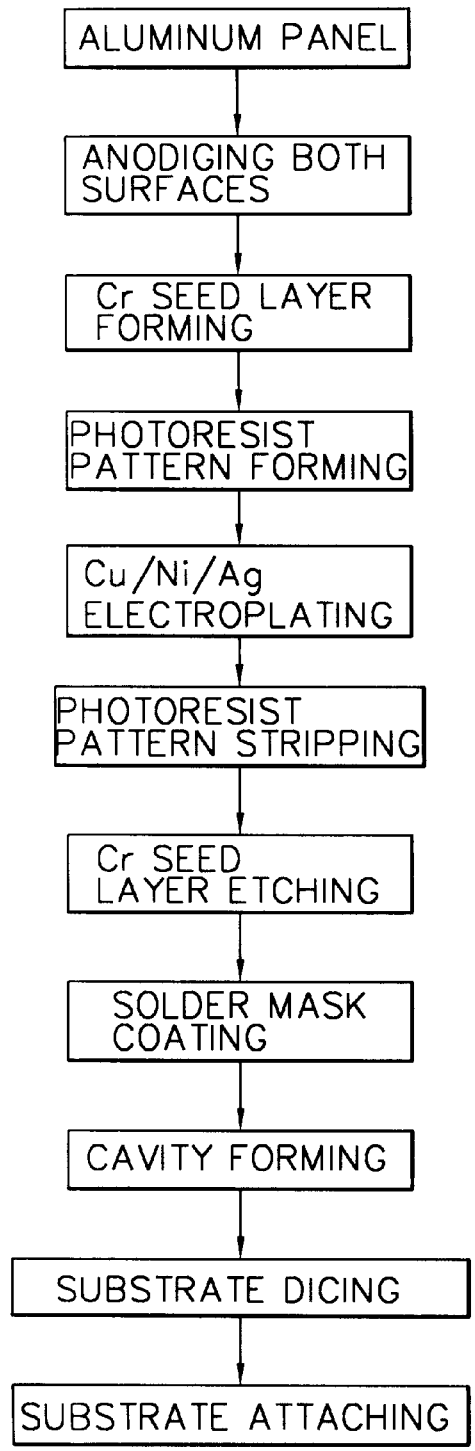
FIG. 2 is a flow chart depicting the manufacturing order of a conventional substrate.
Figure 3:
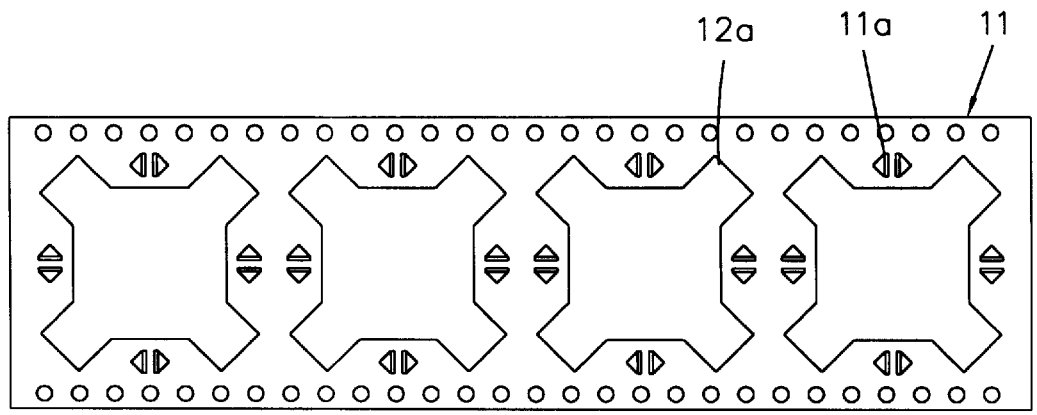
FIG. 3 is a plan view depicting a boat which is used during the assembly of a conventional BGA semiconductor package.
Figure 4A:
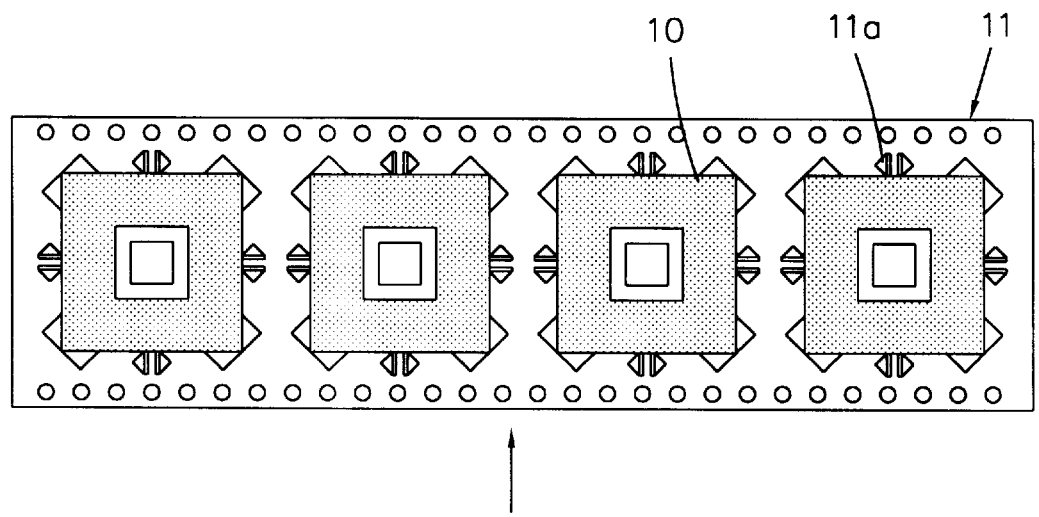
FIG. 4A shows a plan view of after the substrate is placed onto the boat.
Figure 4B:
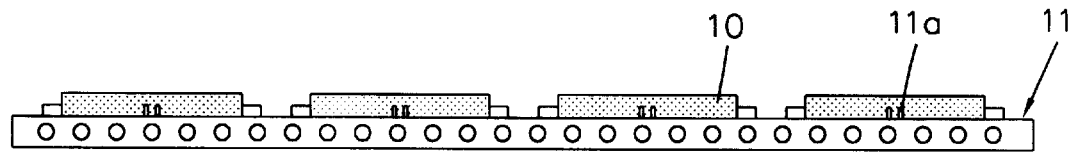
FIG. 4B shows a front view of the structure of FIG. 4A as seen from the direction of the arrows.
Figure 5A:
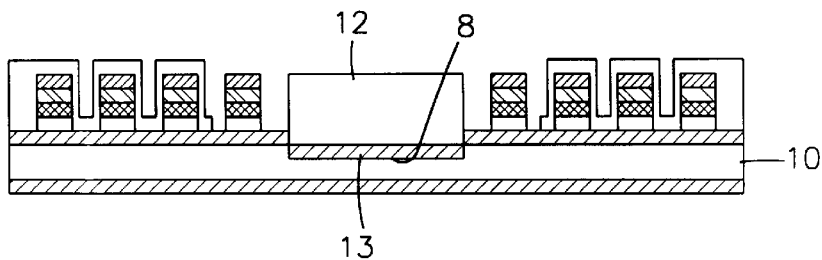
FIGS. 5A through 5E are cross-sectional views showing the manufacturing order of a conventional BGA semiconductor package.
Figure 5B:
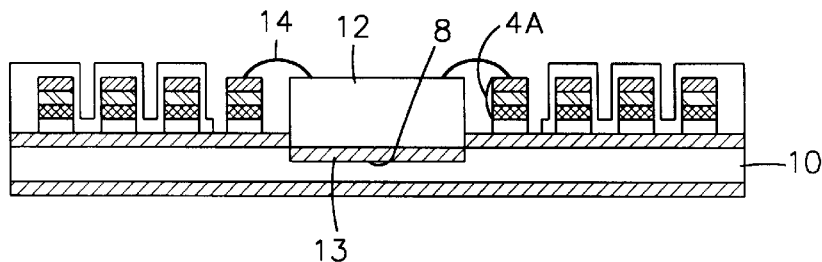
Figure 5C:
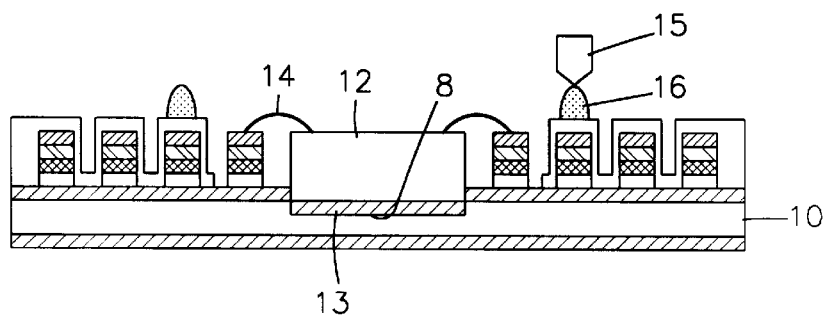
Figure 5D:
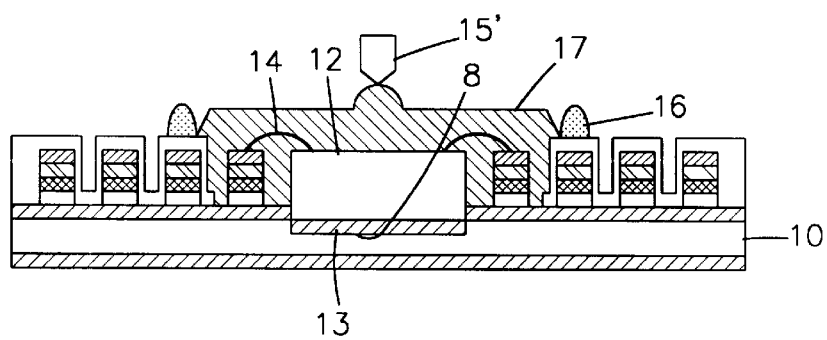
Figure 5E:
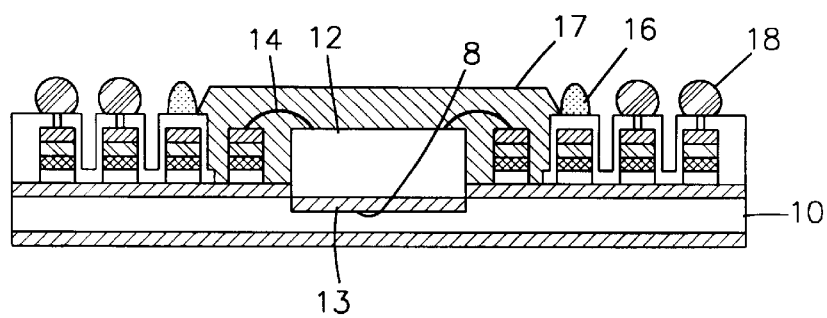
Figure 6:
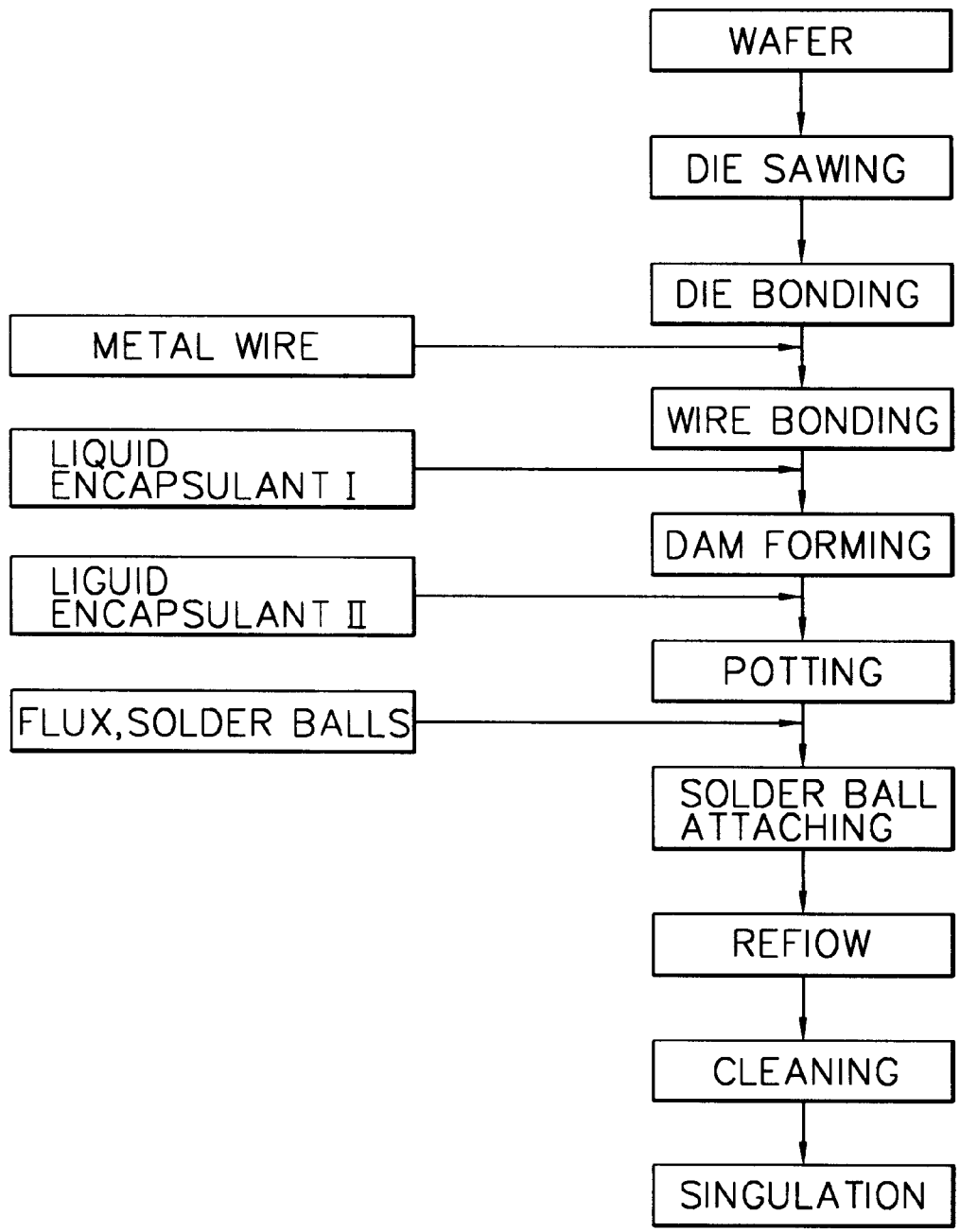
FIG. 6 is a flow chart showing the manufacturing order of a conventional BGA semiconductor package.
Figure 7A:
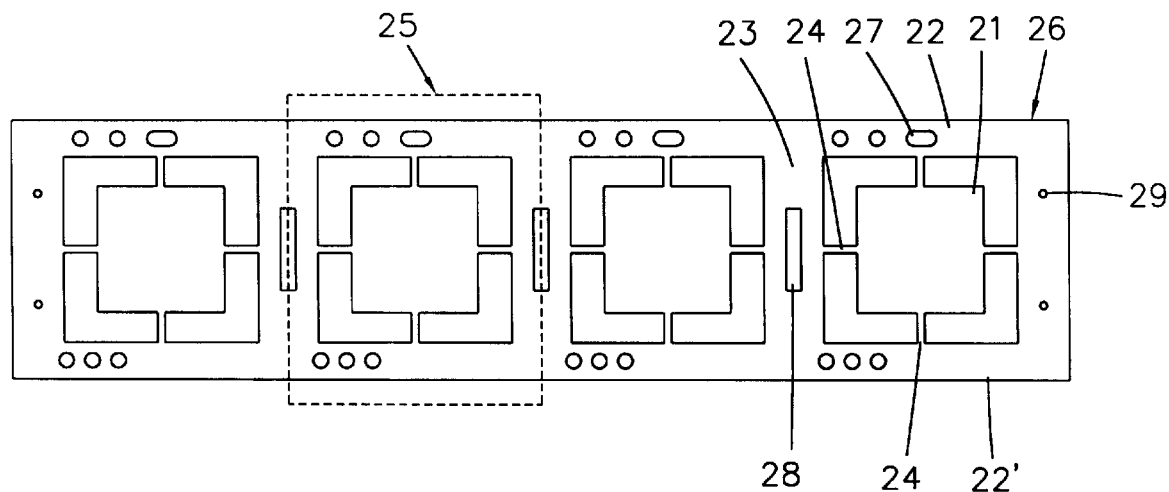
FIG. 7A is a plan view of a strip type carrier frame according to the present invention.

As shown in FIG. 7A, which is a plan view showing the carrier frame structure according to one embodiment of the present invention, a strip structure is formed by a plurality of successive unit frames 25, each having a panel type paddle 21 formed at the center of the upper surface thereof that serves as a die paddle and as a heat sink; side rails 22 and 22' formed at a certain distance from the front and rear of the paddle 21 in order to facilitate automation processing; a connection portion 23 formed at the left and right sides of the paddle 21; and tie bars 24 which connect the side rails 22 and 22' with the connection portion 23 in order to facilitate a trimming process.

A plurality of index holes 27 are formed on the side rails 22 and 22' at predetermined intervals in order to allow the manufacturing equipment to detect the carrier frame 26 position. Also, trimming holes 28 are formed on the connection portions 23 in order to facilitate a trimming process. Align holes 29 are formed on the connection portions 23 at the left and right sides of the carrier frame 26 to allow accurate alignment processing when attachment to the substrate takes place.

Figure 7B:
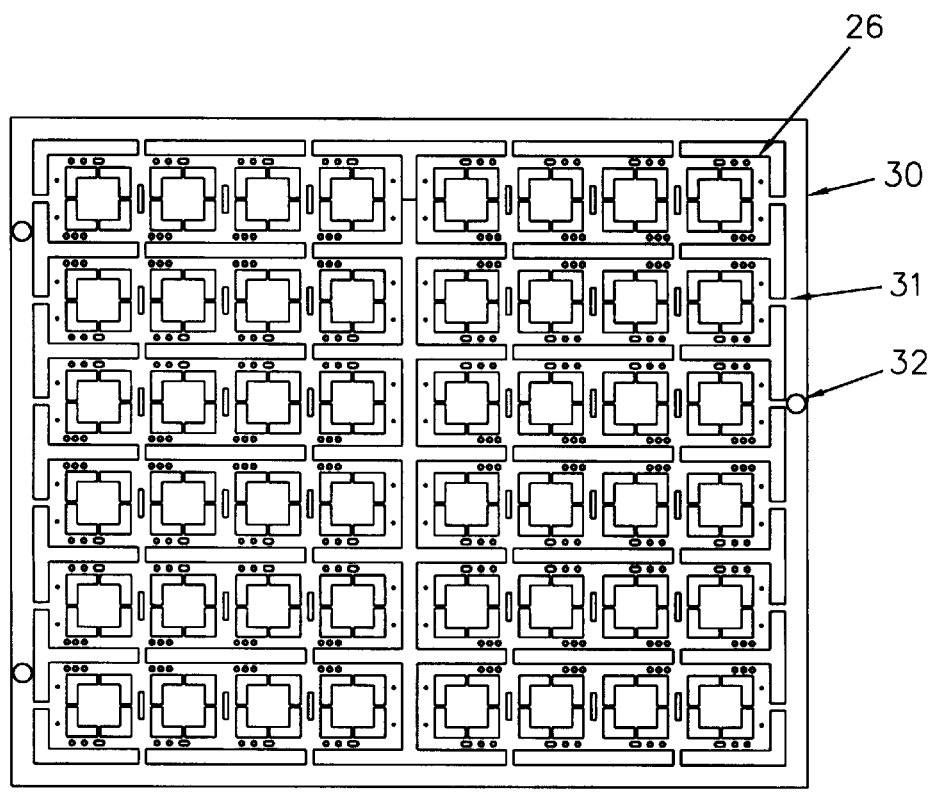
FIG. 7B is plan view of a panel type carrier frame according to the present invention.

FIG. 7B is a plan view showing one embodiment of the panel type carrier frame 30 structure, whereby a plurality of strip type carrier frames are connected together in succession. A plurality of panel align holes 32 are formed on the panel frame 31 to facilitate alignment during attachment of the substrate.

It is preferred that the above carrier frames 26 and 30 are formed to have a thickness of less than 0.5 mm, and the type of material used to form such frames include copper alloy, aluminum alloy and an alloy having 42% nickel, which are highly heat conductive materials.

Figure 8:
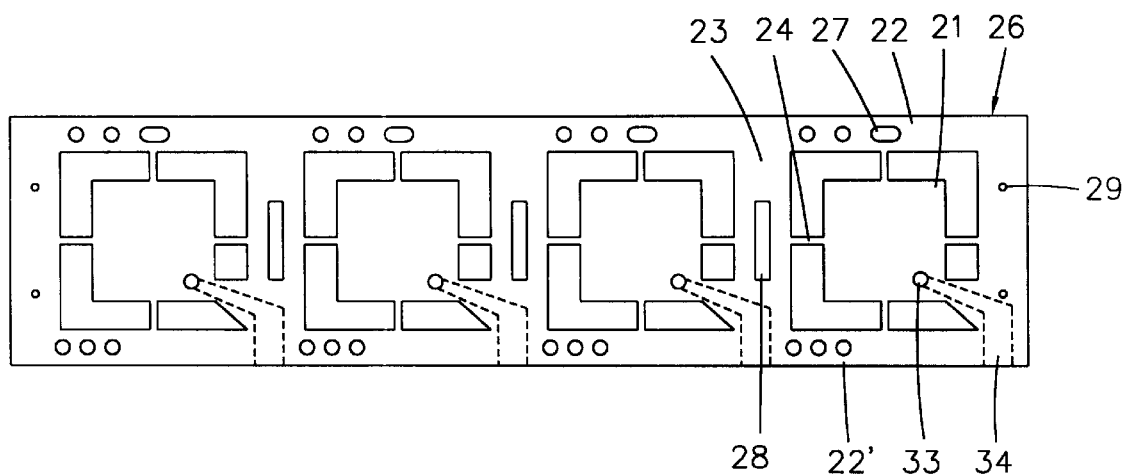
FIG. 8 shows a plan view of a modified embodiment of FIG. 7.

FIG. 8 shows the plan view of a modified embodiment of FIG. 7A whereby the basic structure of the carrier frame is the same as that of FIG. 7A, but an epoxy inserting hole 33 is formed at a certain portion of the paddle 21 in order to minimize costs of using liquid encapsulant. Also, as indicated by the broken lines, vertical gates 34 are formed in order to allow transfer molding.

Figure 9:
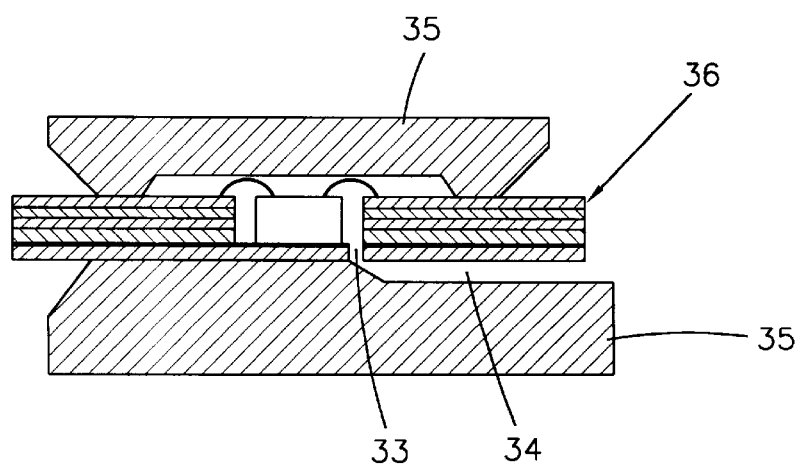
FIG. 9 is a longitudinal cross-sectional view showing the carrier frame of FIG. 8 positioned within a metal die for achieving transfer molding.

FIG. 9 shows the positioning of the BGA semiconductor package 36 within the metal die 35 in order to perform transfer molding according to the modified embodiment.

Figure 10A:
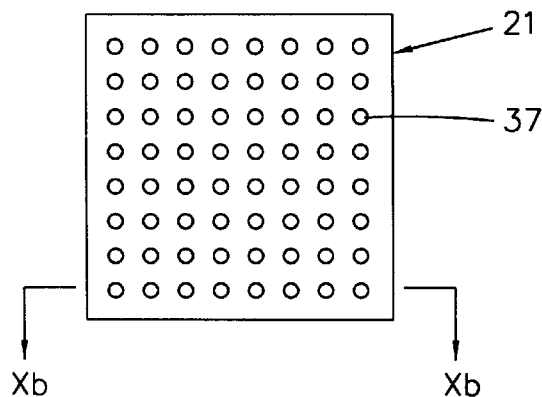
FIG. 10A is a plan view showing a modified embodiment of the paddle in FIG. 7A.
Figure 10B:
FIG. 10B is a cross-sectional view along the line Xb—Xb of the paddle in FIG. 7A.

FIG. 10A is a plan view of a modified version of paddle 21, while FIG. 10B is a longitudinal cross-sectional view as seen from the line Xb—Xb of FIG. 10A. As shown, a plurality of depressions 37 are formed on the upper surface of the paddle 21 by half etching or V-shape etching, to thus increase the overall surface area of the paddle. Here, the diameter of the formed depressions is less than or equal to 0.7 times the thickness of the carrier frame. By forming the depressions 37, the attachment reliability between the carrier frame is the substrate, which will be discussed hereafter, is improved.

Figure 11A:
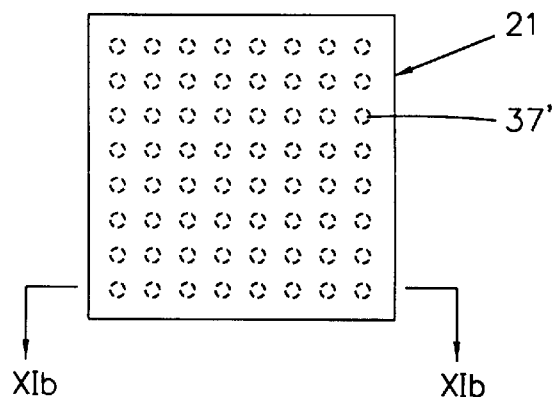
FIG. 11A is a lower view of a modified embodiment of the paddle in FIG. 7A.

FIG. 11A is a lower view of another embodiment of the paddle 21 of FIG. 7A.

Figure 11B:
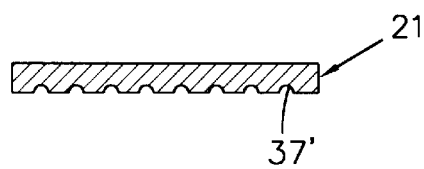
FIG. 11B is a cross-sectional view along the line XIb—XIb of the paddle in FIG. 11A.

FIG. 11B is a cross-sectional view along the line XIb—XIb of FIG. 11A. As shown, a plurality of depressions 37' are formed by half etching or V-shape etching for improving heat dissipation at the lower portion of the paddle, as the overall surface area of the paddle 41 that is externally exposed is advantageously increased. The diameter of the depressions is less than or equal to 0.7 times the thickness of the carrier frame. The depressions 37' not only dissipate heat, but they are also used to improve adhesives when the substrate is connected with the carrier frame.

Figure 12A:
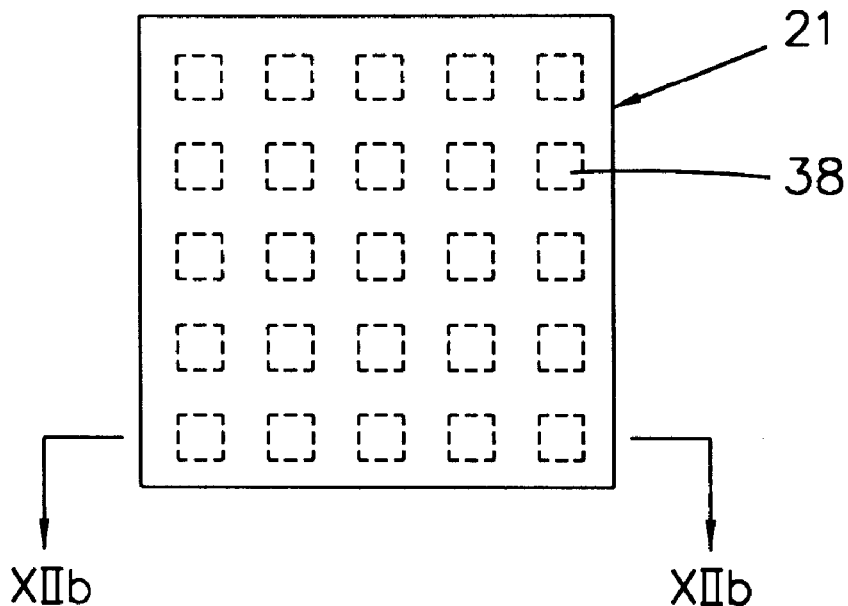
FIG. 12A is a lower view of another modified embodiment of the paddle in FIG. 7A.
Figure 12B:
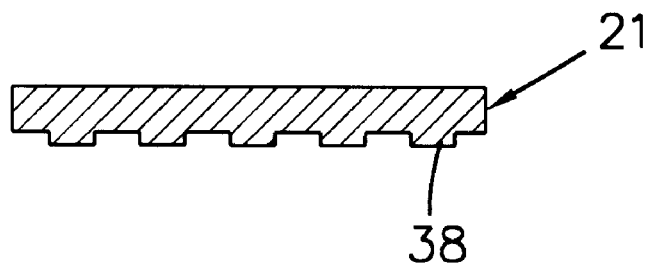
FIG. 12B is a cross-sectional view along the line XIIb—XIIb of the paddle in FIG. 12A.

FIG. 12A shows a lower view of another modified embodiment of the paddle 21 in FIG. 7A. FIG. 12B is a longitudinal cross-sectional view taken along the line XIIb—XIIb of FIG. 12A. To improve heat dissipation, a highly heat conductive adhesive is used to attach a plurality of cooling fins 38 to the lower surface of the carrier frame, so that the package can be applicable to high power devices such as a CPU. Also, a highly heat conductive artificial diamond layer (not shown) having a maximum thickness of 0.5 mm may be coated onto the upper and lower surfaces of the carrier frame using a chemical vapor deposition method, if desired.

Figure 13A:
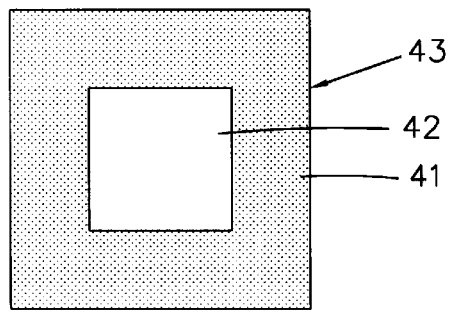
FIGS. 13A through 13C are plan views showing the structure of the substrate according to the present invention.

FIG. 13A is a plan view of the substrate according to the first embodiment of the present invention. As shown herein, the unit substrate 43 comprises a rectangular body 41 having a multi-layer printed circuit formed thereon, and a through hole 42 having a size which allows insertion of a semiconductor chip therethrough is formed within the body. On the upper surface of the body 41, wiring (not shown but formed in the same method as in FIGS. 1A to 1D) is formed.

The manufacturing method of the unit substrate 43 is the same as that for a conventional substrate 10. In other words, wiring is formed on the metal substrate as in FIGS. 1A to 1D. A through hole 42 having a size that is larger than a semiconductor chip is formed at the central portion of the metal substrate.

Figure 13B:
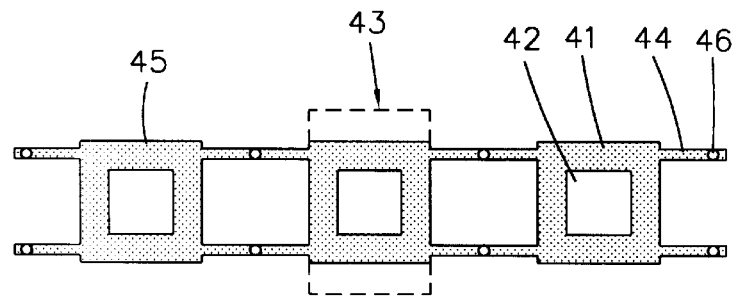

FIG. 13B shows a strip type substrate 45 comprising a plurality of substrates 43 of FIG. 13A being connected in succession with each other by connection bars 44 formed at the left and right sides of the substrate body 41 of each unit substrate 43.

The connection bars 44 have a plurality of align holes 46 formed thereon in order to facilitate alignment during attachment of the strip type substrate 45 on the carrier frame 26 shown in FIGS. 7A to 8.

Here, the width of the substrate 45 is formed to be at least more than 5 mm smaller than the width of the carrier frame 26.

Figure 13C:
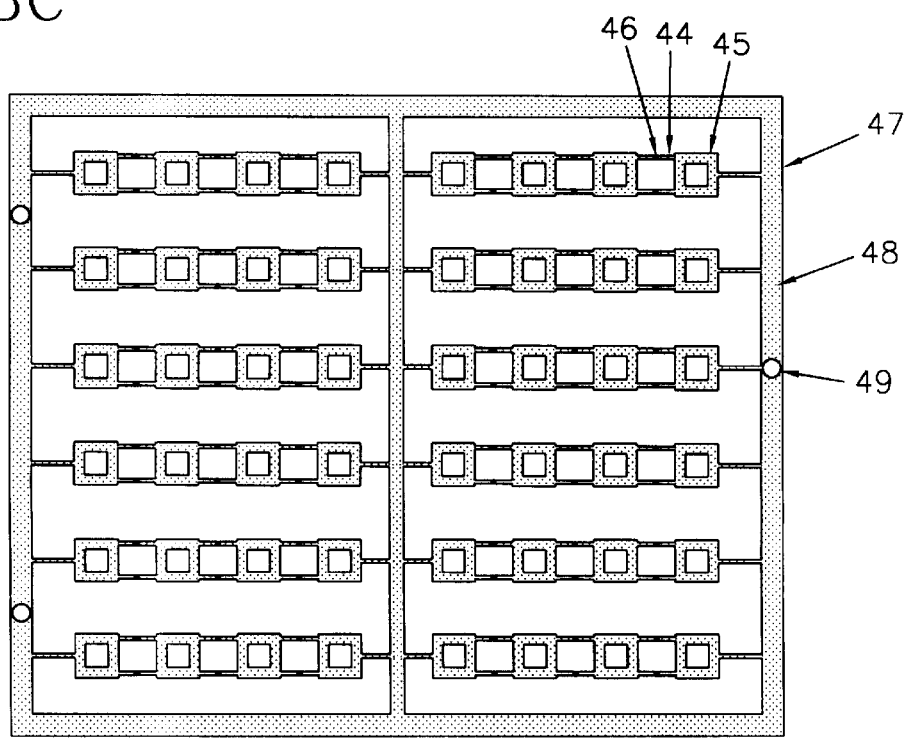

FIG. 13C shows a panel type substrate 47 formed by connecting strip type substrates together in all directions.

A plurality of panel align holes 49 are formed on the periphery of the panel type substrate 47 to facilitate alignment during attachment of the panel type substrate 47 to the panel type carrier frame 30 shown in FIG. 7B.

The embodiments for methods of manufacturing a BGA semiconductor package using the carrier frame 26 and 30 shown in FIGS. 7A, 7B and 8, and substrates 43, 45 and 47 shown in FIGS. 13A to 13C are described as follows.

FIGS. 14A to 14J show a BGA semiconductor package member and method for manufacturing a BGA semiconductor package according to the first embodiment of the present invention.

The first embodiment of the present invention relates to a BGA semiconductor package member made by attaching a strip type carrier frame 26 with a unit substrate 43, and to the manufacturing method of a BGA semiconductor package employing such member. FIGS. 14A to 14J show the plan views and cross-sectional views of the consecutive steps in the BGA semiconductor package manufacturing method according to the first embodiment of the present invention which employs a strip type carrier frame 26 and a unit substrate 43. FIG. 15 is a flow chart showing the manufacturing steps of the above embodiment.

Figure 14A:
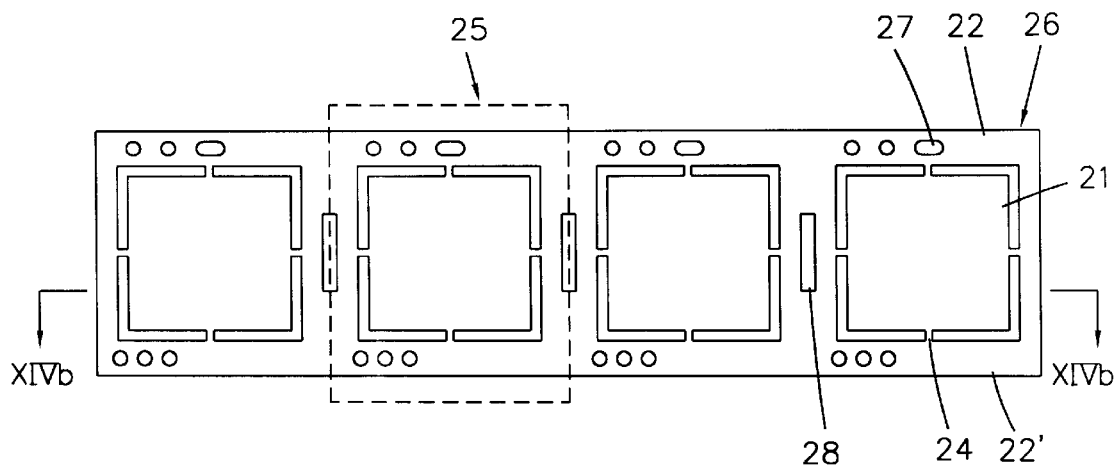
FIGS. 14A through 14J show plan views and cross-section views of the successive manufacturing steps of the semiconductor package according to the first embodiment of the present invention.
Figure 14B:
Figure 15:
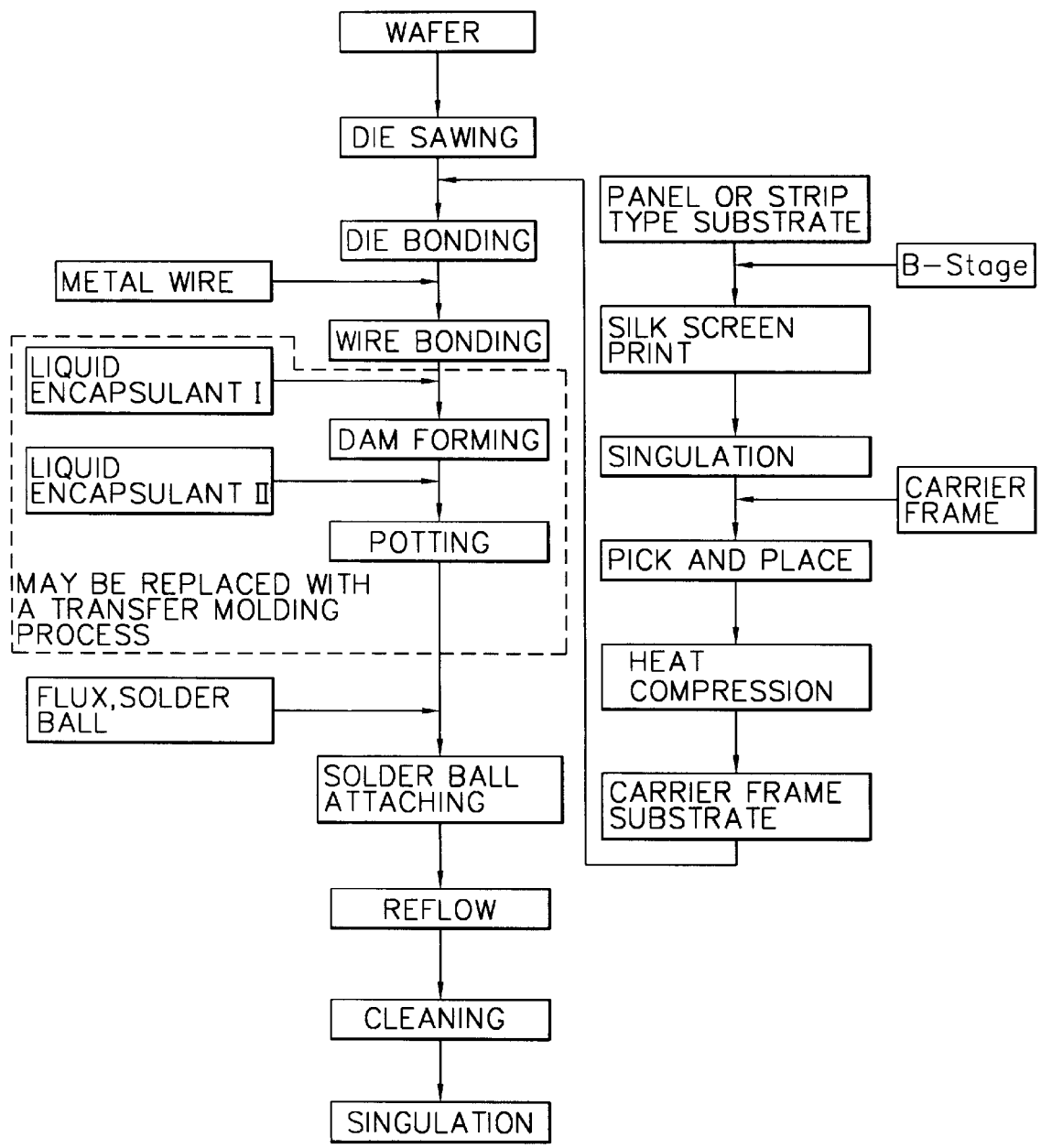
FIG. 15 is a flow chart showing the manufacturing order of the BGA semiconductor package according to the first embodiment of the present invention.

First, a strip type carrier frame 26 as in FIG. 14A is prepared. The strip type carrier frame is made in the same manner as a lead frame of a conventional semiconductor package manufacturing process. FIG. 14B shows a longitudinal cross-sectional view along the XIVb–XIVb' line in FIG. 14A.

Figure 14C:
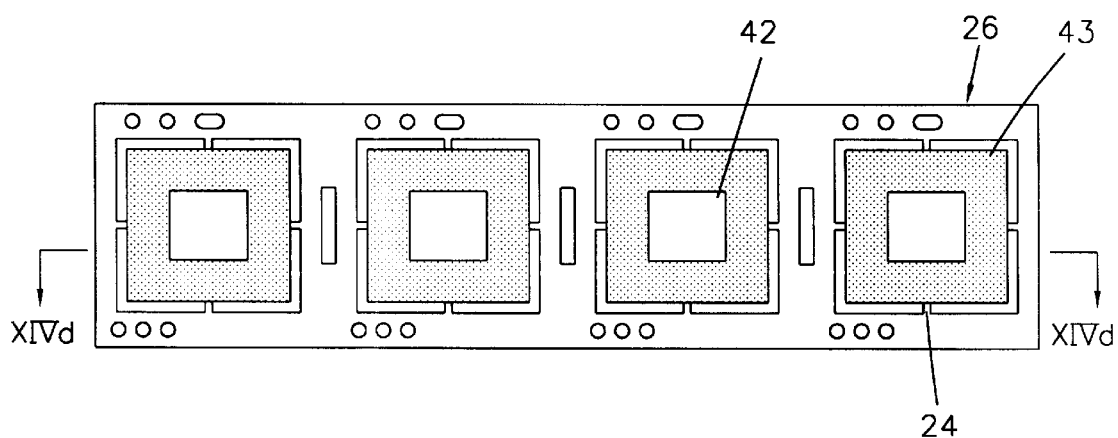
Figure 14D:
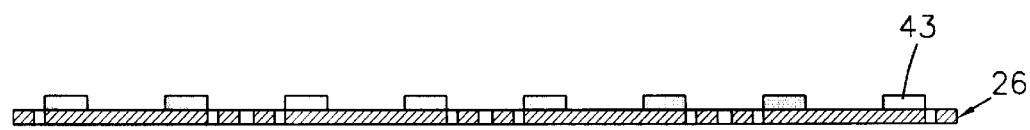

Then, the upper surface of the paddle 21 of the carrier frame 26 shown in FIG. 14A is coated with 20–150 um of sheet type adhesive (referred to as "adhesive sheet" hereafter) or thermal hardening/thermal plasticity epoxy, i.e. A-Stage or B-Stage liquid adhesive is coated using silk screen printing or dispensing processes. Then, a plurality of unit substrates 43 shown in FIG. 13A are placed on the carrier frame 26 through pick and place processing, and adhered by thermal lamination/thermal hardening at a temperature of 100–400° C. to form a BGA semiconductor package member. FIG. 14C is a plan view of the above BGA semiconductor package member, whereby the substrate 43 is attached onto the paddle 21. FIG. 14D is a longitudinal cross-sectional view along the XIVc–XIVc' line in FIG. 14C.

Alternatively, after initially coating an A-Stage or B-Stage type liquid adhesive using a silk screen process onto a panel type substrate 47 or a strip type substrate 45, each unit can be cut and attached to the upper surface of the paddle 21 of the carrier frame 26 using a pick and place process, and then adhered by thermal lamination/thermal hardening at a temperature of 100–400° C.

Figure 14E:
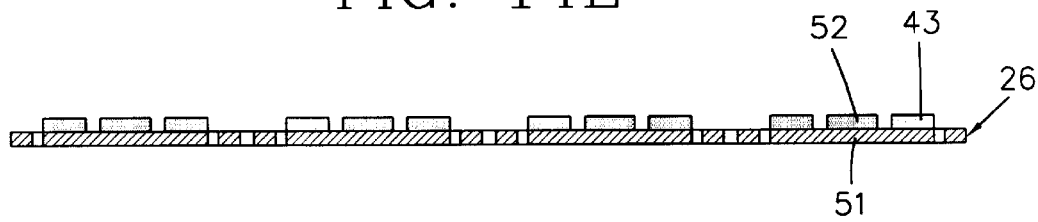
Figure 14F:
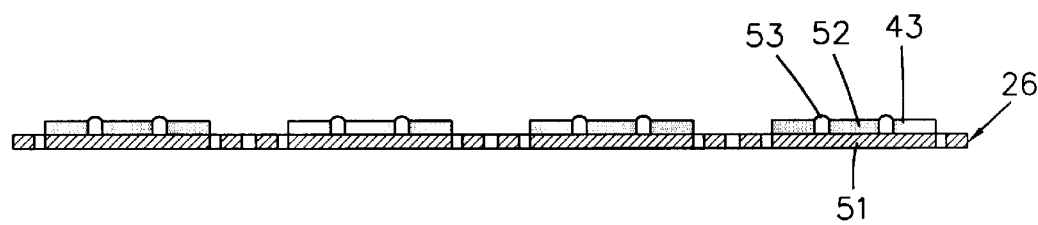

Thereafter, the carrier frame 26 having a plurality of substrates 43 attached thereto is moved using die bonding equipment, and as shown in FIG. 14E, die bonding is performed to attach the chip 52 onto the center portion of the upper surface of the paddle 21 via an adhesive 51. As shown in FIG. 14F, a wire bonding process is performed wherein a plurality of chip pads (not illustrated) formed on the upper surface of the chip 52 and a wiring (not illustrated) on the unit substrate 43 are connected together using metal wiring 53.

Figure 14G:
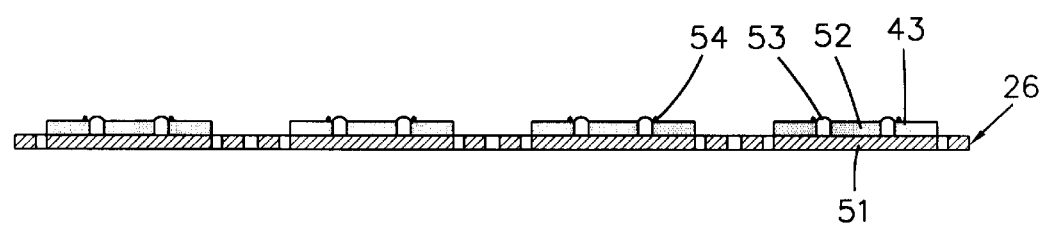
Figure 14H:
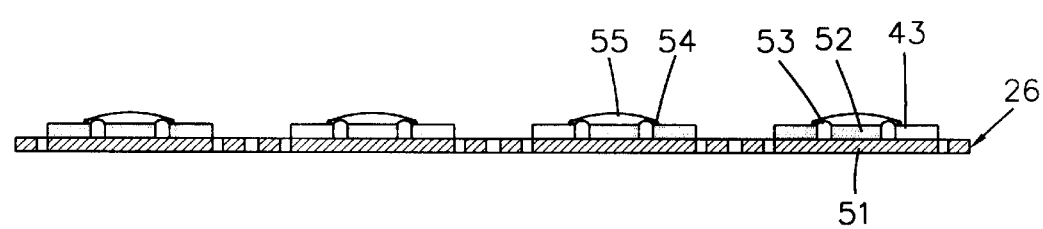

Afterwards, as shown in FIG. 14G, a dam forming process is performed by placing a liquid encapsulant of high viscosity using a dispenser to form a dam 54 having a certain height onto certain portions of the upper surface of the substrate 43. As in FIG. 14H, a potting process is performed by potting an encapsulant material to enclose the chip 52 and metal wiring 53 to form an encapsulant region 55. As shown in FIG. 8, the dam forming process and the potting process may be replaced by a transfer molding process (not illustrated) employing an epoxy inserting hole 31 and a vertical gate 32 formed in the carrier frame.

Figure 14I:
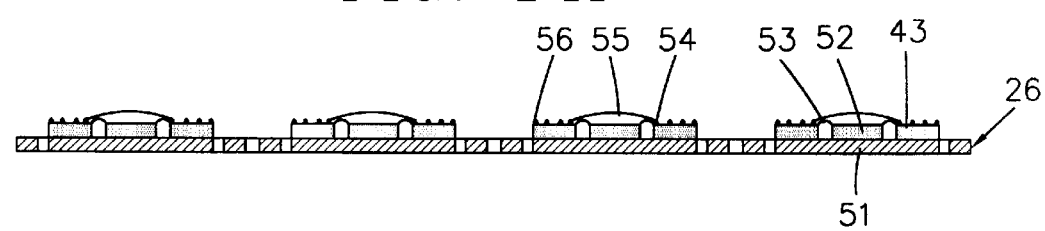

As in FIG. 14I, a solder ball attach process is performed by attaching a plurality of solder balls 56 to the upper surface of the substrate 43, and a reflow process of applying heat to the solder balls 56 is performed to achieve heat compression, and then a cleaning process is performed to remove debris formed during the reflow process.

Figure 14J:
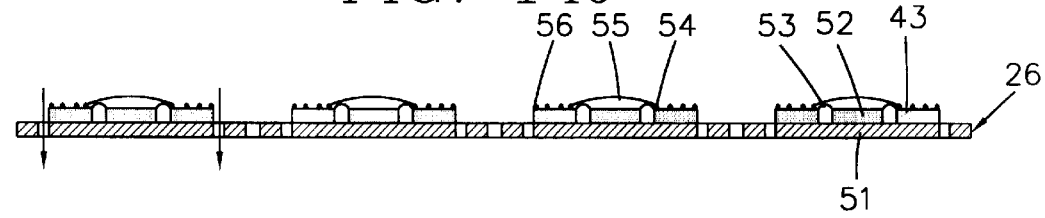

Thereafter, as shown in FIG. 14J, a singulation process is performed to trim each of the tie bars 24 of the carrier frame to thereby form a complete BGA semiconductor package.

FIG. 15 shows a flow chart of the manufacturing steps of the BGA semiconductor package according to the above described first embodiment.

Next, the BGA semiconductor package member and the BGA semiconductor package according to the second embodiment of the present invention is as follows. In the second embodiment, a BGA semiconductor package is formed by attaching a strip type substrate 45 with a strip type carrier frame 26, as depicted in FIGS. 16A through 16J.

Figure 16A:
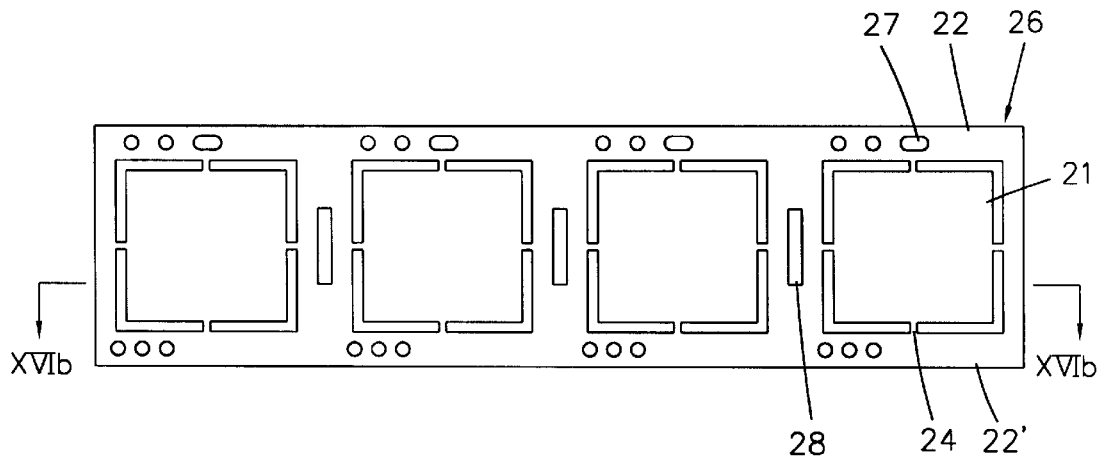
FIGS. 16A through 16J show plan views and cross-section views of the successive manufacturing steps of the semiconductor package according to the second embodiment of the present invention.
Figure 16B:

First, a strip type carrier frame 26 as in FIG. 16A is prepared. FIG. 16B is a longitudinal cross-sectional view along the XVIb–XVIb' line in FIG. 16A.

Figure 16C:
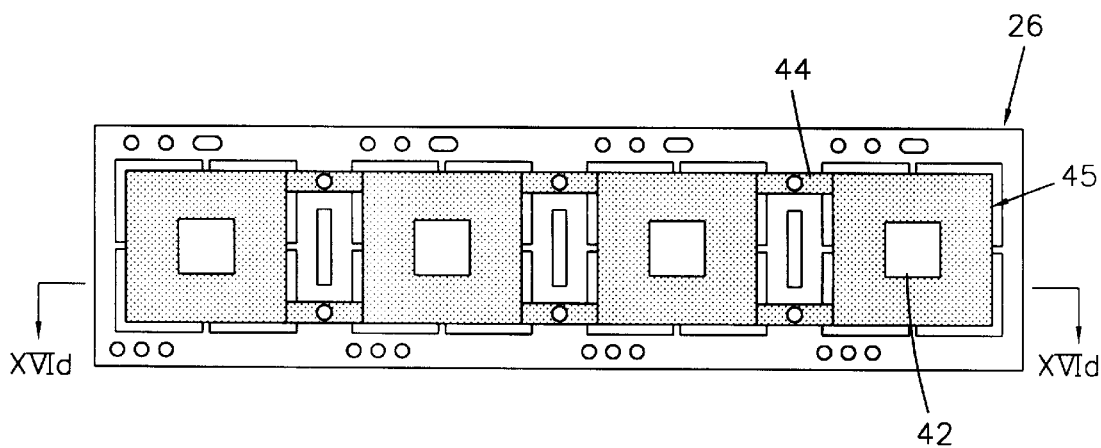

Next, as shown in FIG. 16C, a strip type substrate 45 as in FIG. 13B is attached onto the strip type carrier frame 26 of FIG. 16A. In other words, a 20–150 um adhesive sheet is attached to the upper surface of the paddle 21 of the carrier frame 26 shown in FIG. 16A, or a thermal lamination/thermal plasticity epoxy, i.e. an A-Stage or A-Stage liquid adhesive, is coated onto the paddle 21, then a strip type substrate 45 is attached to the carrier frame 26 and adhered by thermal lamination/thermal hardening at a temperature of 100–400° C.

Alternatively, the strip type substrate 45 can be attached to the paddle 21 of the strip type carrier frame 26, after initially coating an A-Stage or B-Stage type liquid adhesive using a silk screen process onto the strip type substrate 45. Also, the above liquid adhesive may be coated onto a panel type substrate 47, then cut into strips and attached to the strip type carrier frame 26.

Figure 16D:
Figure 16E:
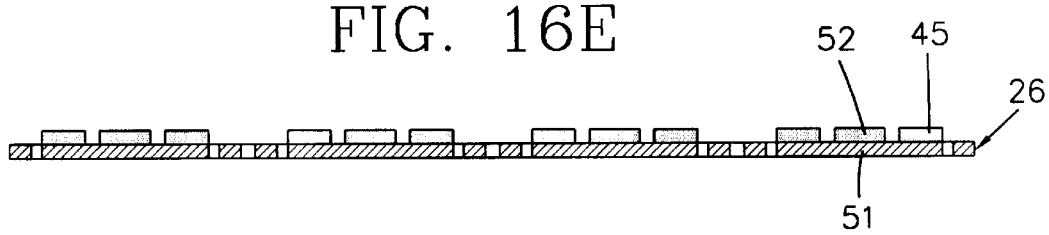
Figure 16F:
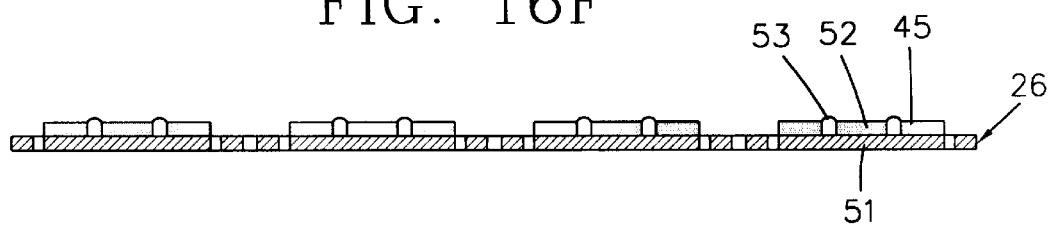
Figure 16G:
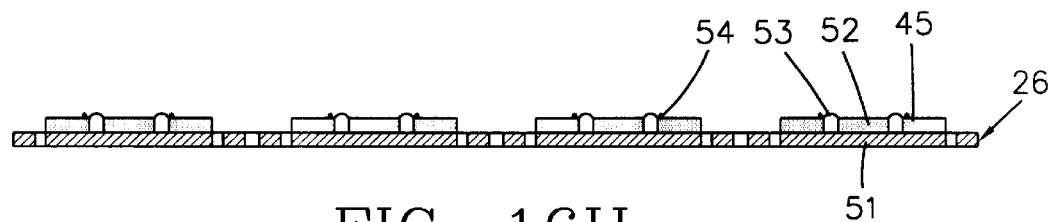
Figure 16H:
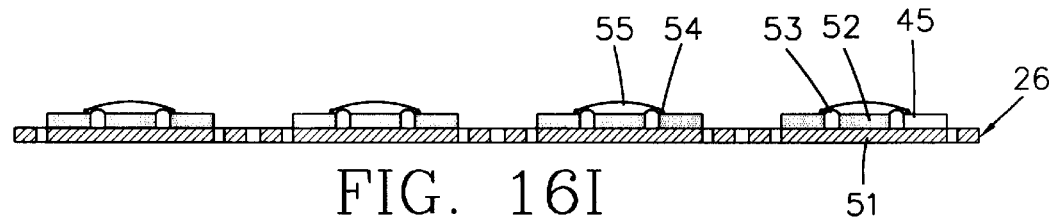
Figure 16I:
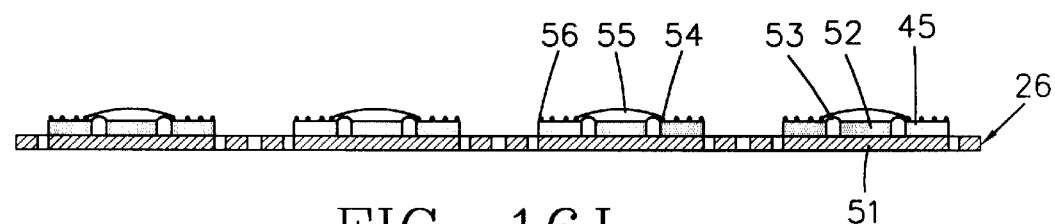

FIG. 16D is a longitudinal cross-sectional view along the XVId–XVId' line of FIG. 16C.

Afterwards, as shown in FIGS. 16E through 16I, the die bonding, wire bonding, dam forming, solder ball attach, reflow and cleaning processes are performed in sequence. The process shown in FIGS. 16E to 16I are the same as those shown in FIGS. 14E to 14I.

Figure 16J:
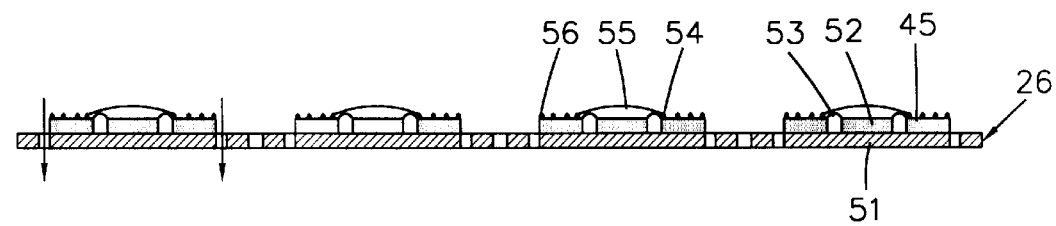

Thereafter, as shown in FIG. 16J, a singulation process is performed to cut each of the tie bars 24 of the carrier frame 26 as well as the connection bars 44 of the substrate 45 to thereby form a complete BGA semiconductor package.

Figure 17:
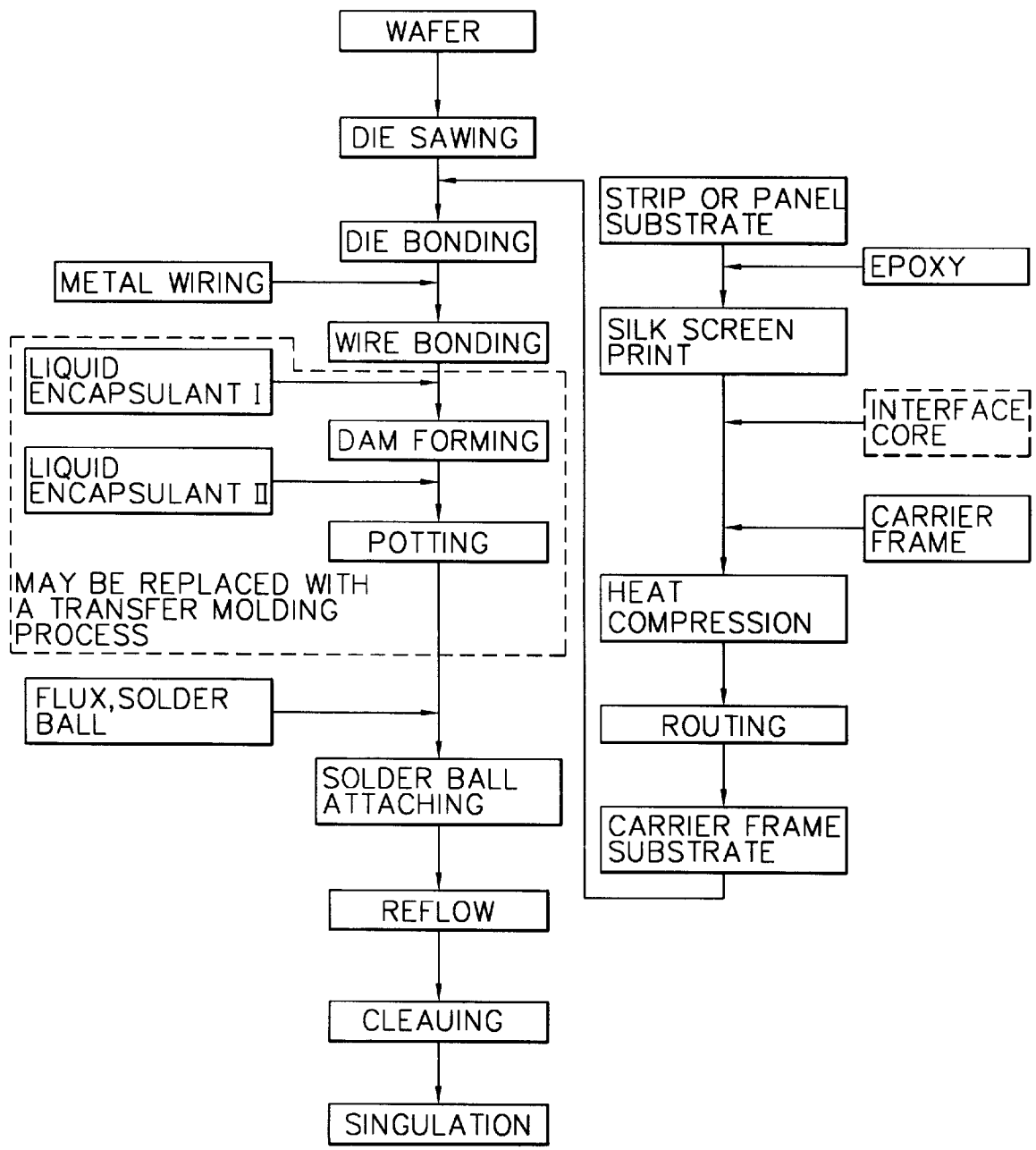
FIG. 17 is a flow chart showing the manufacturing order of the BGA semiconductor package according to the second embodiment of the present invention.

FIG. 17 is a flow chart showing the manufacturing process of the BGA semiconductor package according to the second embodiment of the present invention.

The manufacturing processes for a BGA semiconductor package member and a BGA semiconductor package according to the third embodiment of the present invention will be explained as follows.

Figure 19:
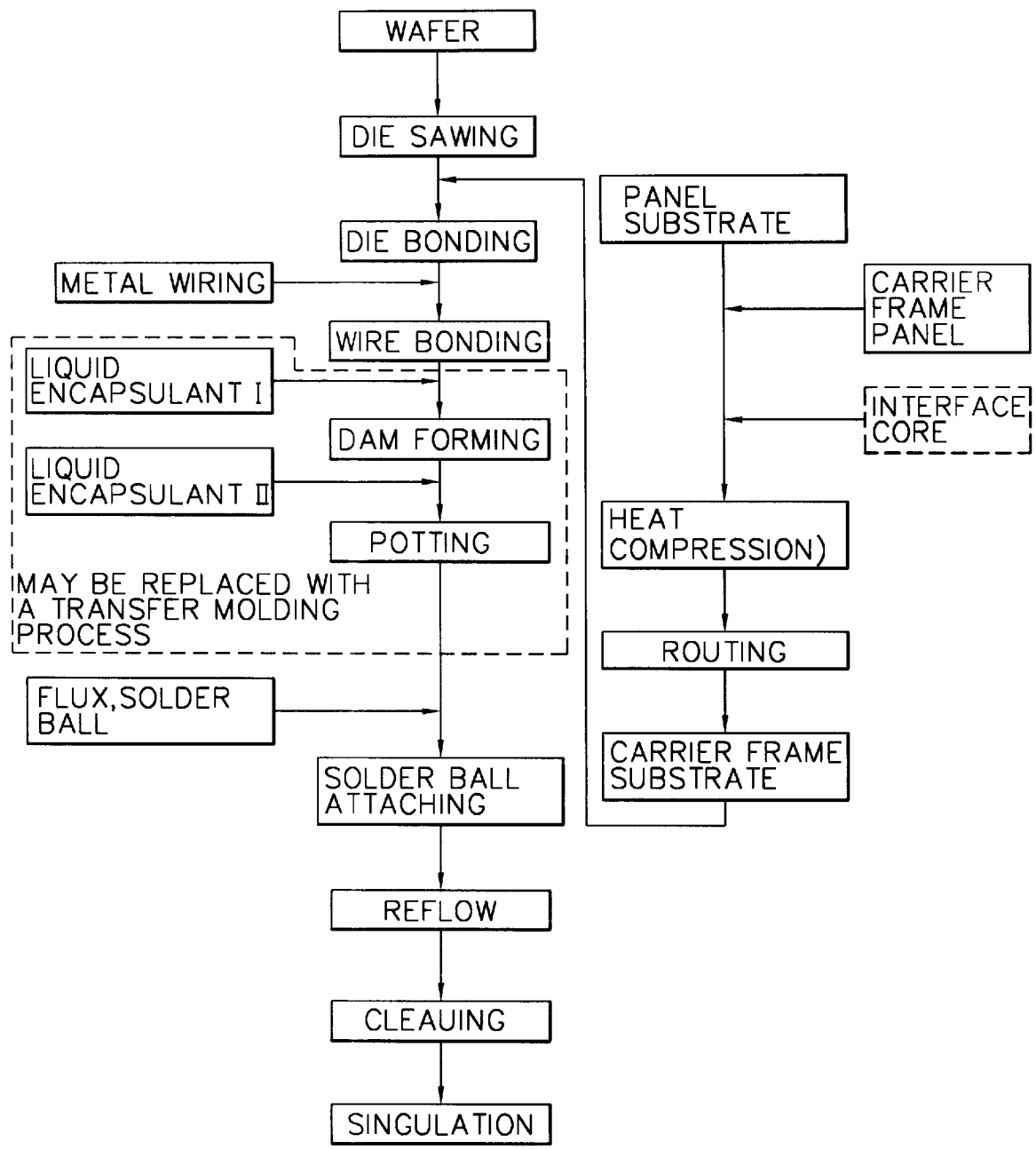
FIG. 19 is a flow chart showing the manufacturing order of the BGA semiconductor package according to the third embodiment according to the present invention.

According to the third embodiment, a BGA semiconductor package member is formed by attaching the panel type carrier frame 30 of FIG. 7B with the panel type substrate 47 of FIG. 13C. This member is then used to manufacture a BGA semiconductor package, and FIG. 19 is a flow chart showing the steps in manufacturing the BGA semiconductor package according to the third embodiment.

Figure 18:
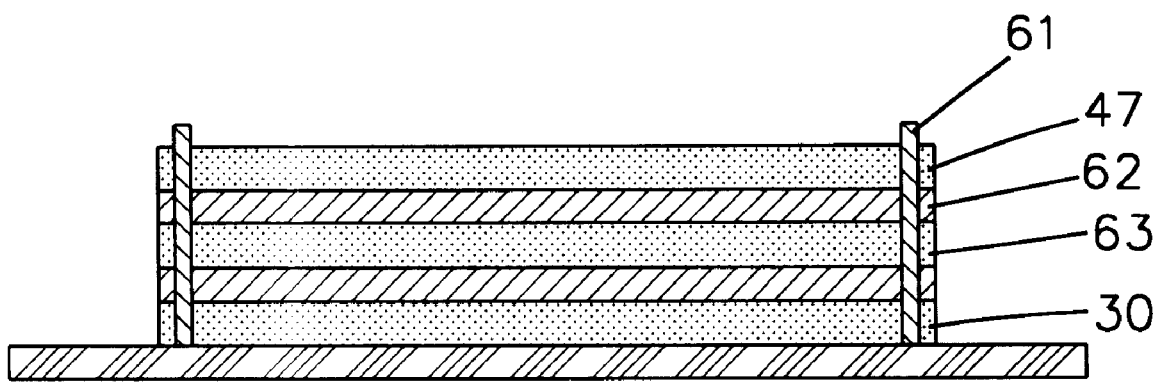
FIG. 18 is a longitudinal cross-sectional view showing the attached state of the carrier frame and the substrate according to an embodiment of the present invention.

FIG. 18 shows a simplified cross-section of the BGA semiconductor package member according to the third embodiment of the present invention. A sheet type adhesive 62 (referred to as 'adhesive sheet' hereafter) that has been routed or metal processed according to the shape of the panel type substrate 47 is inserted between the panel type carrier frame 30 of FIG. 7B and the panel type substrate 47 of FIG. 13B. Then, the panel type carrier frame 30 and the panel type substrate 47 adhered by thermal lamination/thermal hardening at a temperature of 100–400° C.

Alternatively, instead of the above adhesive sheet 62, an A-Stage or B-Stage liquid adhesive can be coated onto the upper surface of the paddle 21 of the panel type carrier frame 30 using a silk screen printing or dispensing process, then the panel type substrate 47 is placed onto the liquid adhesive layer and the panel type carrier frame 30 is adhered with the panel type substrate 47 by thermal lamination/thermal hardening at a temperature of 100–400° C.

Here, a layered element 61 can be inserted through the alignment hole formed on the substrate 47 and the carrier frame 30 in order to hold the carrier frame 30, the adhesive sheet 62 and the substrate 47 in place.

Also, an interface core 63 may be formed within the adhesive sheet between the substrate 47 and the carrier frame 30. The interface core 63 has a cavity formed at a portion which covers the semiconductor chip. Also, The interface core 63 has an adhesive sheet 62 formed on the upper and lower surfaces thereof. The interface core 63 can be made of metal, BT resin, FR4, FR5, polyamide and the like. The interface core 63 can be interposed between the carrier frame 30 and the substrate 47, and the entire structure is held in place by inserting a layered element into the alignment holes formed in the carrier frame 30 and the substrate 47.

Then, in the same manner as in the first and second embodiments, die bonding, wire bonding, dam forming, solder ball attach, reflow and cleaning processes are performed for each unit of panels.

Thereafter, a singulation process is performed to trim the connection bars 44 of the unit substrate 43 in the panel substrate 47, and to trim each of the tie bars 24 of the unit carrier frame 25 in the panel carrier frame 30, to thereby form a complete BGA semiconductor package.

As described in detail above, the BGA semiconductor package member made by employing the carrier frame and the substrate according to the present invention has an analogous structure as that of a lead frame for a conventional semiconductor package, thus conventional semiconductor package manufacturing equipment can be used for production. Thus, there is no need for providing any additional equipment and manufacturing costs are minimized.

Additionally, since the packaging process can be performed using not only a unit substrate, but also either a strip type or a panel type substrate, automation and high speed processing of the overall manufacturing operation is achieved to thus minimize production costs and improve productivity.

Although several preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A ball grid array (BGA) semiconductor package member, comprising:
   a carrier frame having a plurality of paddles, a side rail for supporting the paddles, and a connection portion for connecting the paddles together, wherein each of the paddles has at least one epoxy insertion hole passing therethrough; and
   a substrate having at least one body which is attached onto one of the plurality of paddles, the body having a multi-layer circuit disposed therein and the body having a through hole formed at a center portion thereof.

2. The BGA semiconductor package member according to claim 1, wherein the carrier frame is a strip type carrier frame having a plurality of paddles connected together in a row.

3. The BGA semiconductor package member according to claim 1, wherein the carrier frame is a panel type carrier frame having a plurality of side rails connected together by connection bars.

4. The BGA semiconductor package member according to claim 1, wherein the substrate is a unit substrate comprising individually separated substrates.

5. The BGA semiconductor package member according to claim 1, wherein the substrate is a strip type substrate having a plurality of substrates connected together in a row by connection bars.

6. The BGA semiconductor package member according to claim 1, wherein the substrate is a strip type substrate having a plurality of substrates connected together in a plurality of rows by connection bars.

7. The BGA semiconductor package member according to claim 1, wherein the substrate is a panel type substrate having a plurality of unit substrates connected together by connection bars to form a panel.

8. The BGA semiconductor package member according to claim 1, wherein the carrier frame is made of a material selected from the group consisting of copper alloy, aluminum alloy, and an alloy having approximately 42% nickel.

9. The BGA semiconductor package member according to claim 1, wherein the paddles have a plurality of depressions formed on an upper and lower surfaces thereof.

10. The BGA semiconductor package member according to claim 1, wherein cooling fins are attached to lower surfaces of the paddles.

11. A ball grid array (BGA) semiconductor package member, comprising:
    a carrier frame having a plurality of paddles, a side rail for supporting the paddles, and a connection portion for connecting the paddles together, wherein the paddles have a plurality of depressions formed on at least one of an upper and a lower surface thereof; and
    a substrate having at least one body which is attached onto one of the paddles, the body having a multi-layer circuit disposed therein, and the body having a through hole formed at a center portion thereof.

12. The BGA semiconductor package member of claim 11, wherein the carrier frame is a strip type carrier frame having a plurality of paddles connected together in a row.

13. The BGA semiconductor package member of claim 11, wherein the carrier frame is a panel type carrier frame having a plurality of side rails connected together by connection bars.

14. The BGA semiconductor package member of claim 11, wherein the plurality of depressions are formed on the lower surfaces of the paddles.

15. The BGA semiconductor package member of claim 11, wherein the plurality of depressions are formed on the upper surfaces of the paddles.

16. The BGA semiconductor package member of claim 11, wherein the plurality of depressions are formed on both the upper and lower surfaces of the paddles.

* * * * *